United States Patent [19]
Fukui et al.

[11] Patent Number: 5,609,737
[45] Date of Patent: Mar. 11, 1997

[54] FILM MANUFACTURING METHOD USING SINGLE REACTION CHAMBER FOR CHEMICAL-VAPOR DEPOSITION AND SPUTTERING

[75] Inventors: Hirofumi Fukui, Taiwa-machi; Masanori Miyazaki; Masami Aihara, both of Sendai; Chisato Iwasaki, Miyagi-ken; Koichi Fukuda; Yasuhiko Kasama, both of Sendai, all of Japan

[73] Assignee: Frontec Incorporated, Miyagi, Japan

[21] Appl. No.: 289,713

[22] Filed: Aug. 12, 1994

[30] Foreign Application Priority Data

Aug. 24, 1993 [JP] Japan ................................... 5-209760

[51] Int. Cl.⁶ .................... C23C 14/34; C23C 16/00
[52] U.S. Cl. ................. 204/192.12; 204/298.23; 427/248.1
[58] Field of Search ..................... 118/723 E; 427/248.1; 204/298.01, 298.02, 298.06, 298.08, 192.12, 192.23, 298.23

[56] References Cited

U.S. PATENT DOCUMENTS

| | | | |
|---|---|---|---|
| 4,525,375 | 6/1985 | Hanak | 118/723 E X |
| 4,597,159 | 7/1986 | Usami et al. | 204/192.23 |
| 4,673,588 | 6/1987 | Bringmann et al. | 118/723 E X |
| 4,874,494 | 10/1989 | Ohmi | 204/298.06 X |
| 4,978,437 | 12/1990 | Wirz | 204/192.23 |
| 4,992,153 | 2/1991 | Bergmann et al. | 204/298.26 X |
| 5,423,971 | 6/1995 | Arnold et al. | 118/723 E X |

OTHER PUBLICATIONS

"Plasma Enhanced CVD for Flat Planel Displays" Feb. 1992, *Solid State Technology*, pp. 94–97 and 113.

*Primary Examiner*—Nam Nguyen
*Attorney, Agent, or Firm*—Guy W. Shoup; Patrick T. Bever

[57] ABSTRACT

A method for manufacturing thin films in which a first film is formed on a substrate using chemical-vapor deposition (CVD), and a second film is formed on the substrate using sputtering, wherein the processes are sequentially performed in the same deposition chamber without exposing the substrate to an oxidative atmosphere. The deposition chamber includes a first electrode, and a second electrode located under the first electrode. During the CVD process, a dummy target is mounted on the first electrode and the substrate is mounted on the second electrode, a reactive gas is introduced into the chamber, and high frequency electrical power is applied to both the first and second electrodes, thereby causing the constituents of the reactive gas to deposit on the substrate to form the first film. Subsequently, any remaining reactive gas is removed from the chamber and an automated mechanism removes the dummy target from the first electrode and stores the dummy target in a storage chamber. A sputtering electrode is then mounted on the first electrode and a sputtering gas is introduced into the reaction chamber. High frequency electrical power is then applied to both the first and second electrodes, thereby causing the sputtering gas and sputtering target to deposit the second film on the substrate.

4 Claims, 6 Drawing Sheets

FILM MANUFACTURING METHOD USING SINGLE REACTION CHAMBER FOR CHEMICAL-VAPOR DEPOSITION AND SPUTTERING

FIELD OF THE INVENTION

The present invention relates to a film manufacturing method for use in manufacturing devices, such as TFT's (Thin Film Transistors), which are formed by laminating a multiplicity of thin films, and a film manufacturing apparatus for effectively carrying out the method.

DESCRIPTION OF THE RELATED ARTS

When manufacturing devices, such as TFT's, which are formed by laminating a multiplicity of thin films on a substrate, it has been conventional to provide a CVD chamber dedicated for each of the films to be laminated and form the films in the dedicated deposition chambers one by one. This is because reactive gases and film depositing conditions are different depending on films to be formed. If different films were formed successively on a substrate in the same deposition chamber, components of reactive gases used in the preceding deposition step would remain in the deposition chamber in a state of adhering to its inner wall, and these remained components would be taken into a film formed in the subsequent step with high probability. Thus, devices being stable in the film quality could not be manufactured.

In the case of successively forming films on a substrate in separate deposition chambers as mentioned above, however, there is a fear that when the substrate is transferred from one deposition chamber to another, the film may be contaminated by an atmosphere during the transfer.

Hitherto, a CVD apparatus has generally been arranged such that deposition chambers of the apparatus are connected to each other and a substrate is transferred between the adjacent two deposition chambers. When depositing a gate insulating film, a semiconductor film and an ohmic contact layer on a substrate to manufacture a TFT, for example, the CVD apparatus comprises five chambers, i.e., a load chamber, a gate insulating film deposition chamber, a semiconductor film deposition chamber, an ohmic contact layer deposition chamber, and an unload chamber which are connected in series, for the purpose of avoiding contamination of the interface between the films. However, such a 5-room apparatus has been problematic in that the size of the apparatus itself is large, the cost of the apparatus itself is high, and the area of a clean room for installing the apparatus is increased.

As means for solving the problem mentioned above, it has heretofore been tried to deposit a plurality of films in the same deposition chamber. According to this technique, the CVD apparatus comprises four chambers, i.e., a load chamber, a gate insulating film/ semiconductor film deposition chamber, an ohmic contact layer deposition chamber, and an unload chamber so that a gate insulating film and a semiconductor film are formed in the same deposition chamber. Thus, in such a film manufacturing apparatus, the number of deposition chambers is reduced by forming a gate insulating film and a semiconductor film in the same deposition chamber. But that 4-room construction requires plasma cleaning between a deposition process of the gate insulating film and a deposition process of the semiconductor film to remove contamination on the inner wall surface of the deposition chamber by material gases ($NH_3$ etc.) during the deposition of the gate insulating film.

It is basically desired that the gate insulating film/semiconductor film deposition chamber and the ohmic contact layer deposition chamber are further constructed as one deposition chamber. However, special material gases (e.g., phosphine $PH_3$, diborane $B_2H_6$) for use in depositing the ohmic contact layer are apt to contaminate the inner wall surface of a deposition chamber, and the contamination on the inner wall surface of the deposition chamber by the above special material gases cannot be removed by conventional plasma cleaning. For that reason, it has been essential to provide the gate insulating film/semiconductor film deposition chamber and the ohmic contact layer deposition chamber independently of each other.

Therefore, the film manufacturing apparatus of the above-described type for laminating a multiplicity of films still has a plurality of deposition chambers and is not sufficiently small in size and weight. In other words, a further reduction in both the apparatus cost and the area necessary for installing the apparatus is demanded.

Also, if the apparatus includes a plurality of deposition chambers, a laminate under the manufacture process must be transferred from one deposition chamber to another with a risk that the laminate may be contaminated during the transfer.

Further, materials gases, i.e., phosphine and diborane, used in depositing the ohmic contact layer by CVD are toxic, and handling these toxic gases accompanies a high degree of danger.

FIG. 6 shows one example of a conventional process for depositing a gate insulating film ($SiN_x$), a semiconductor film (a-Si(i): intrinsic amorphous silicon), and an ohmic contact layer (a-Si($n^+$)) on a substrate.

In the illustrated example, the films and the layer are deposited by using a load chamber 1, a heating chamber 2, a process 1 chamber 3, a buffer chamber 4, a process 2 chamber 5, a process 3 chamber 6, and an unload chamber 7. The chambers 3, 5, 6 for deposition are separate for each of the films to be formed, but have the same structure. The buffer chamber 4 is used when the gate insulating film is deposited at a different temperature from that for the semiconductor film and the ohmic contact layer.

FIG. 7 shows a typical structure of each of the chambers 3, 5, 6 used in this example. In the illustrated chamber, a substrate 8 is placed in a bottom portion of a deposition chamber S, an upper electrode 9 is placed in a top portion of the deposition chamber S, and an RF power supply 9a is connected to the upper electrode 9 through a matching circuit 9b for supplying an RF power to the electrode 9. When carrying out the plasma enhanced CVD in this apparatus, it is usual that an RF power of 13.56 MHz is supplied to the upper electrode 9, while the substrate 8 and the deposition chamber S are electrically grounded. Material gases used to deposit the films are shown in Table 1 below.

TABLE 1

| Type of Films | Type of Gases Used |
| --- | --- |
| Gate insulating film ($SiN_x$) | $SiH_4$, $NH_3$, $H_2N_2$ |
| Semiconductor film (a-Si(i)) | $SiH_4$, $H_2$ |
| Ohmic contact layer | |
| (a-Si($n^+$)) | $SiH_4$, $H_2$, $PH_3$ |
| (a-Si($p^+$)) | $SiH_4$, $H_2$, $B_2H_6$ |

Plasma cleaning is performed in the above process to remove useless films and gases deposited on an inner wall surface of the deposition chamber S. The following items are important to produce a plasma condition necessary for the plasma cleaning:

(1) plasma density is high, (2) plasma spreads entirely in the deposition chamber, and (3) plasma potential is so low as not to cause sputtering on the inner wall surface of the deposition chamber.

However, the deposition chamber S constructed as described above suffers the problem below.

Because the excitation frequency is constant at 13.56 MHz, the RF power applied must be increased for achieving the higher plasma density to satisfy the above requirement. But an increase in the RF power applied would increase the plasma potential and the DC bias of the power supply. Therefore, the energy of ions irradiated to the opposite electrode and the inner wall surface of the deposition chamber would be so increased as to cause sputtering on materials of the opposite electrode and the inner wall surface rather than cleaning. This would lead to a fear that the deposition chamber may newly be contaminated by the electrode materials.

A review will now be made of the problem in the plasma enhanced CVD process.

A film deposition reaction progresses with energy produced by heat and plasma on the substrate surface under the following relationship:

ETOTAL=Et+Ep, Ep=I×E i o n where ETOTAL: energy applied to the substrate surface Et : thermal energy Ep : plasma energy I : ion flux (which means amount of ions irradiated to the substrate)

Eion : ion bombardment energy

It is found from the above relationship that when a film is deposited at low temperature, control of the plasma energy is important in control of the film quality because the thermal energy is small. If the ion bombardment energy is too small, the total energy would not exceed a threshold value necessary for the reaction, the plasma energy would not contribute to the reaction in this case irrespective of the amount of ions irradiated. On the other hand, if the ion bombardment energy is too large, the deposited film would be damaged conversely. To deposit a good-quality film at low temperature, therefore, it is required to optimize the ion bombardment energy (Eion) and the ion flux (I).

FIG. 9 shows a potential distribution in the deposition chamber of the conventional CVD apparatus (see FIG. 7). The ion energy bombarding to the substrate is given by a potential difference (Vp) between the plasma potential and the grounded substrate, while the ion energy irradiated to the opposite electrode is given by a potential difference (Vp− Vdc) between the dc bias (Vdc) and the plasma potential. The ion flux (I) bombarding to the substrate is given by I=(Vpp)/(Power). FIG. 8 shows how those plasma parameters are varied when a pressure and an RF power are changed. Specifically, FIG. 8 shows variations in the ion flux (I), the ion energy (Vp) bombarding the substrate, and the ion energy (Vp−Vdc) per ion irradiated to the opposite electrode. It is apparent from the results of FIG. 8 that the plasma parameters are varied simultaneously depending on changes in the pressure and the RF power.

Therefore, it has been necessarily difficult to optimize the CVD conditions by using the film manufacturing apparatus shown i n FIG. 7.

SUMMARY OF THE INVENTION

In view of solving the problems described above, an object of the present invention is to provide a film manufacturing method and apparatus by which a plurality of films are laminated with a reduction in both size and weight of the apparatus, while ensuring high quality of the films and safety during the manufacture.

To achieve the above object, according to the film manufacturing method of the present invention, film deposition by a CVD process in which first and second electrodes are disposed in a pressure-reducible deposition chamber in opposite relation, a substrate is attached to the second electrode, an RF power is supplied to the first electrode, an RF power is supplied to the second electrode as well, and reactive gases are supplied to the deposition chamber, thereby depositing a film on the substrate, and film deposition by a sputtering process in which a target for sputtering is attached to the first electrode i n the same deposition chamber, the substrate is attached to the second electrode, an RF power is supplied to the first electrode, and an RF power is supplied to the second electrode as well, thereby depositing a film on the substrate, are carried out successively without exposing the substrate to an oxidative atmosphere.

In the above film manufacturing method, preferably, when depositing a film by the sputtering process, the RF power is supplied to the first electrode under a condition of applying a predetermined bias potential of −100 dc V or below to the first electrode.

In the above film manufacturing method, preferably, the film deposited by the CVD process is a non-single crystal silicon film or a nitride film of non-single crystal silicon.

In the above film manufacturing method, preferably, the film deposited by the sputtering process is a non-single crystal silicon film containing phosphor or boron.

To achieve the above object, the film manufacturing apparatus of the present invention comprises a deposition chamber capable of maintaining a pressure-reduced state, a transfer mechanism for loading and unloading a substrate to and from the deposition chamber, a reactive gas supply mechanism for supplying reactive gases to the deposition chamber, a first electrode disposed in the deposition chamber for attachment of a sputtering target thereto, a second electrode disposed in the deposition chamber for attachment of the substrate thereto, a first RF power supply for supplying an RF power to the first electrode, a dc power supply for supplying a dc voltage to the first electrode, and a second RF power supply for supplying an RF power to the second electrode.

In the above film manufacturing apparatus, preferably, the transfer mechanism loads the sputtering target from a stacker chamber, which is held in a pressure-reduced state, to the deposition chamber before the start of sputtering, and unloads the sputtering target from the deposition chamber, which is held in a pressure-reduced state, to the stacker chamber and attaches a dummy target to the first electrode after the sputtering.

With the method of the present invention, the CVD process in which the RF power is applied to the first and second electrodes in the deposition chamber, the substrate is attached to the second electrode, and the reactive gases are supplied to the deposition chamber, and the sputtering process in which the target is attached to the first electrode, the substrate is attached to the second electrode, and the RF power is applied to both the electrodes, are carried out successively without exposing the substrate to an oxidative atmosphere. When laminating a plurality of films, therefore, these films can be deposited one above another by the CVD process and the sputtering process without causing oxidation of the films.

Also, since the first and second electrodes are supplied with the RF power separately, the ion bombardment energy and the ion flux can be controlled independently of each other. Accordingly, plasma with a high plasma density can be produced in spite of small ion energy, and plasma cleaning of the deposition chamber can be surely performed by using the produced plasma. Thus, in the case of carrying out the CVD process and the sputtering process successively in the same deposition chamber, the problem of element contamination attributable to the preceding step can be avoided by conducting the plasma cleaning before the subsequent sputtering.

When a film is deposited by the sputtering process, the sputtering efficiency can be increased by supplying the RF power while applying the bias potential of −100 V or below to the first electrode.

Practically, non-single crystal silicon films and nitride films of non-single crystal silicon can be formed by the CVD process, and non-single crystal silicon films containing phosphor or boron can be formed by the sputtering process.

Furthermore, by using the apparatus which includes the deposition chamber, the stocker chamber, the transfer mechanism, the reactive gas supply mechanism, the hold mechanism, the support mechanism, the first power supply, the second power supply, and the dc power supply, the CVD process and the sputtering process can be effected in one deposition chamber. As a result, the number of deposition chambers can be reduced as compared with the prior art, making it possible to achieve a reduction in size and weight of the apparatus and to reduce the area necessary for installing it.

DETAILED DESCRIPTION OF THE PREFERRED EMBODIMENT

One preferred embodiment of the present invention will hereinafter be described.

Figure 1:
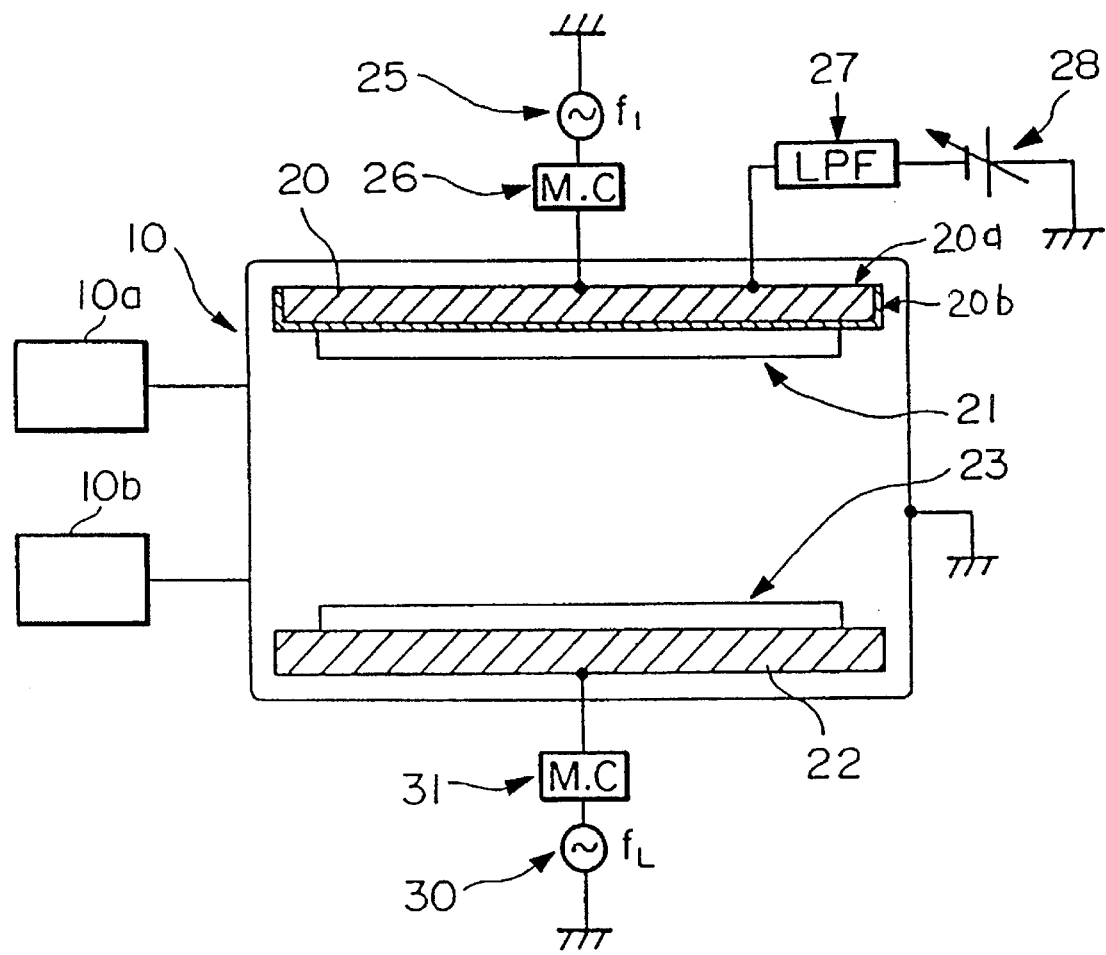
FIG. 1 is a view showing a structure of a deposition chamber in a film manufacturing apparatus according to the present invention.
Figure 2:
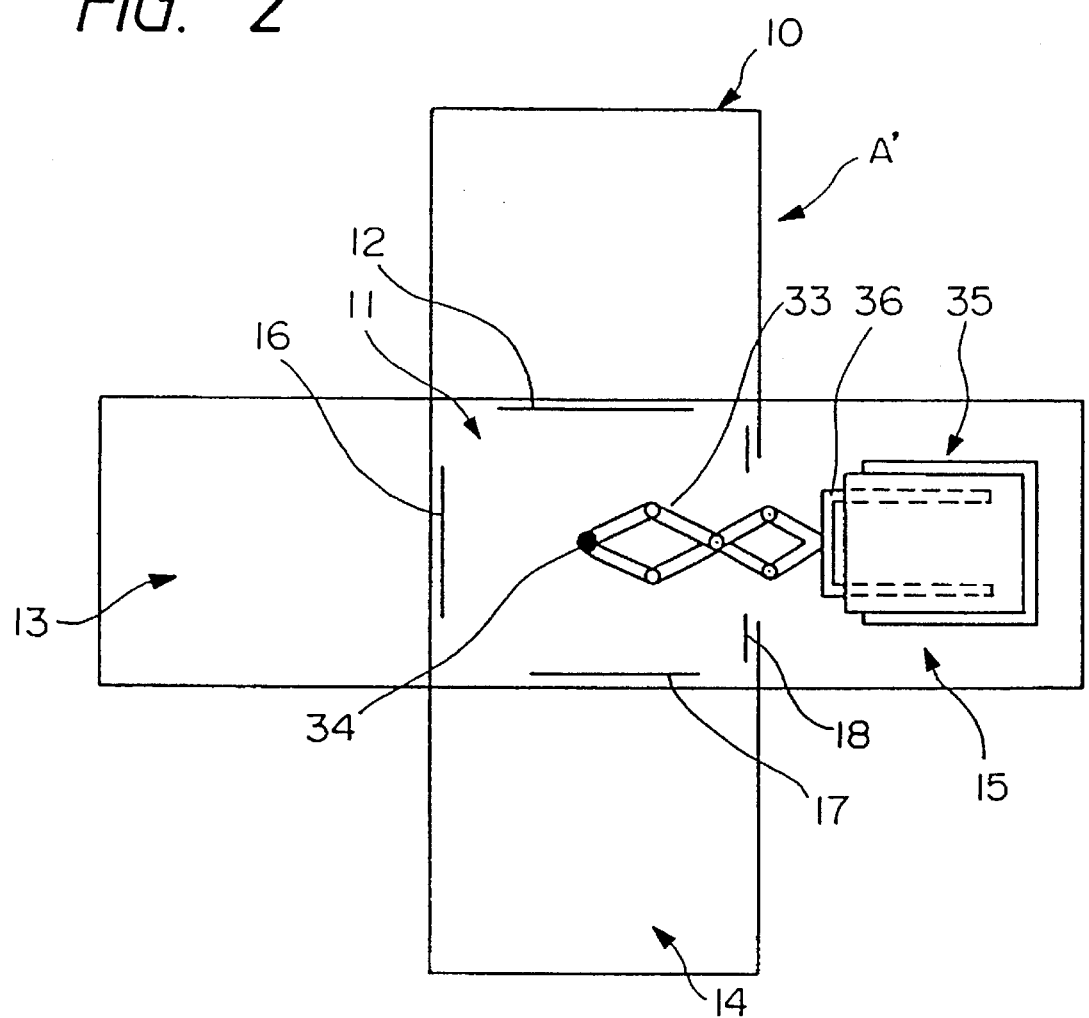
FIG. 2 is a plan view showing an entire structure of the apparatus according to the present invention.
Figure 3:
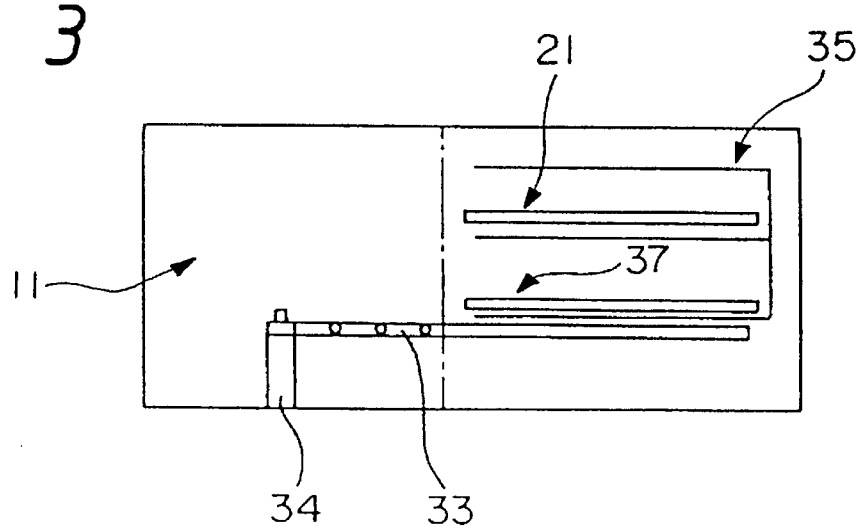
FIG. 3 is a side view, partly enlarged, of the apparatus shown in FIG. 2.

FIG. 1 shows a pressure-reducible deposition chamber 10 which is, as shown in FIG. 2, connected to one side of a transfer chamber 11 through a gate valve 12. In addition to the deposition chamber 10, a load chamber 13, an unload chamber 14 and a stocker chamber 15 are connected to the transfer chamber 11 in surrounding relation, and gate valves 16, 17, 18 are provided between the transfer chamber 11 and the respective surrounding chambers. Thus, a film manufacturing apparatus A' is constituted by the deposition chamber 10, the transfer chamber 11, the load chamber 13, the unload chamber 14 and the stocker chamber 15.

In the deposition chamber 10, as shown in FIG. 1, a first electrode 20 is disposed in a top portion thereof and a target 21 is detachably attached to a lower surface of the first electrode 20, while a second electrode 22 is disposed in a bottom portion of the deposition chamber 10 and a substrate 23 is detachably attached to an upper surface of the second electrode 22. The target 21 can be attached in place by using a known target mounting mechanism such an electrostatic chuck.

The first electrode 20 comprises a base member 2a made of an electrically conductive material and a protective layer 20b formed on a surface of the base member 20a. The protective layer 20b is formed of an oxide film, a nitride film or a fluoride film, specifically $SiO_2$, $Si_3N_4$, $Al_2O_3$, $CrO_3$ or AlN, which is hard to corrode when exposed to plasma of chloride-base corrosive gas or the like.

An RF power supply (first power supply) 25 for outputting RF power is connected to the first electrode 20 with a matching circuit 26 inserted between the first electrode 20 and the RF power supply 25. The matching circuit 26 serves to make zero reflected waves of the RF power. Also connected to the first electrode 20 is a dc power supply 28 through a band-pass filter 27 such as a low-pass filter for adjustment of impedance. The band-pass filter 27 serves to adjust the circuit impedance to have an infinite value so that no RF waves are superposed on a dc power from the dc power supply 28.

Further, an RF power supply (second power supply) 30 for outputting RF power is connected to the second electrode 22 with a matching circuit 31 inserted between the second electrode 22 and the RF power supply 30, the matching circuit 31 serving to act as with the matching circuit 26.

Additionally, the deposition chamber 10 is associated with a pumping system 10a for evacuating gas, a mechanism 10b for supplying process gases into the deposition chamber 10, and so on. These components are shown in the simplified form in FIG. 1 for the sake of brevity.

A link type transfer mechanism (magic hand) 33 is disposed in the transfer chamber 11. The transfer mechanism 33 is rotatable about a support shaft 34 vertically provided at the center of the transfer chamber 11 so that the target 21 can be taken out of a cassette 35 disposed in the stocker chamber 15 and then transferred to the deposition chamber 10, as needed, for attachment to the first electrode 20 in the deposition chamber 10. A dummy target 37 is also accommodated in the cassette 35 so that it can be transferred to the deposition chamber 10 as needed.

A process of laminating films on the substrate 23 by using the apparatus of the above construction will now be described.

The film manufacturing apparatus shown in FIG. 1 can deposit three thin films (e.g., a gate insulating film, a semiconductor film and an ohmic contact layer) successively in the single deposition chamber 10. In other words, plasma enhanced CVD (deposition of the gate insulating film and the semiconductor film) and sputtering (deposition of the ohmic contact layer) can be performed in the deposition chamber 10 by adjusting the RF frequencies and feeding different gases into the chamber.

First, after vaccuming the loading chamber 13, the gate valves 12, 18 are opened and the transfer mechanism 33 is moved for attaching the dummy target 37 to the first electrode 20 in the deposition chamber 10 and the substrate 23 to the second electrode 22. The gate valve 12 is closed in the above condition, and the thin films are then formed successively on the substrate 23 in accordance with the following steps.

(1) Substrate cleaning step

For the purpose of removing the contaminants, impurities such as $H_2O$, $CO_2$ or native oxide on the surface of the substrate 23, a mixed gas atmosphere of Ar+$H_2$ is created in the deposition chamber 10, the dummy target 37 made of Si, $SiO_2$ or the like is attached to the first electrode 20 as described above, the substrate 23 is attached to the second electrode 22, RF power at frequency of 200 MHz is supplied from the RF power supply 25 to the first electrode 20, and a load potential of the first electrode 20 is floated to thereby perform plasma cleaning. In this plasma cleaning, the frequency supplied to the first electrode is set to be so high that the ion energy applied to the dummy target 37 becomes small and the dummy target 37 attached to the first electrode 20 is not sputtered. A power applied to the second electrode is adjusted, for example, so that the ion energy applied to the substrate 23 is in the range of 10 to 20 eV.

(2) CVD step of gate insulating film "$SiN_x$ film"

A mixed gas atmosphere of $SiH_4$+$NH_3$+$N_2$ is created in the deposition chamber 10, the dummy target is left as it is, RF power at frequency of 200 MHz is supplied from the RF power supply 25 to the first electrode 20, and the load potential is floated to thereby produce plasma so that the plasma enhanced CVD is effected to deposit an $SiN_x$ film on the substrate. In this CVD step, the frequency supplied to the first electrode is set to be so high that the ion energy applied to the first electrode 20 becomes small and the dummy target 37 attached to the first electrode 20 is not sputtered. Simultaneously, an RF power is supplied to the second electrode 22 to control the ion energy applied to the substrate 23.

(3) Substrate cleaning step

A mixed gas atmosphere of Ar+$H_2$ is created in the deposition chamber 10, the dummy target 37 is left attached to the first electrode 20, RF power at frequency of 200 MHz is supplied from the RF power supply 25 to the first electrode 20, and the load potential is floated to thereby perform plasma cleaning of the substrate. In this plasma cleaning, the frequency supplied to the first electrode is set to be so high that the ion energy applied to the dummy target 37 becomes small and the dummy target 37 attached to the first electrode 20 is not sputtered.

(4) CVD step of semiconductor film "a-Si (i) film"

A mixed gas atmosphere of $SiH_4$+$H_2$ is created in the deposition chamber 10, the dummy target 37 is left attached to the first electrode 20, RF waves at frequency of 200 MHz is supplied from the RF power supply 25 to the first electrode 20, and an RF power is supplied to the second electrode 22 to control the ion energy applied to the substrate 23, thereby sputtering an a-Si(i) film.

(5) Sputtering step of ohmic contact layer "a-Si($n^+$) film"

An Ar gas atmosphere is created in the deposition chamber 10, the target 21 made of P-doped Si for producing an a-Si($n^+$) film is attached to the first electrode 20, RF power at frequency of 13.56 MHz is supplied from the RF power supply 25 to the first electrode 20, and a load potential applied from the dc power supply 28 is set to $-200$ V to perform sputtering, thereby depositing an a-Si($n^+$) film. In this step, the ion energy applied to the target 21 must be increased. For this reason, the RF frequency supplied to the first electrode 20 is set to 13.56 MHz.

(6) Cleaning step of deposition chamber

The substrate 23 is removed, the target 21 is removed and the dummy target 37 is attached instead, an $NF_3$ gas atmosphere is created in the deposition chamber 10, and RF power at frequency of 200 MHz is supplied from the RF power supply 25 to the first electrode 20, thereby cleaning the gases, etc. adhering to the inner wall surface of the deposition chamber 10 and simultaneously etching films of $SiN_x$, a-Si(i). To this end, a dc voltage is applied to the dummy target 37 to control the ion energy necessary for the etching.

During the above sputtering step, a potential of $-100$ V or below is preferably applied from the dc power supply 28 for increasing the sputtering efficiency of the target 21. On the contrary, in the above CVD step, a potential of $-100$ V or below is not required to be applied because of no necessity of sputtering the dummy target 37.

Assuming now that the number of atoms sprung out of the target due to the sputtering is A, the plasma potential is Vp, the self-bias applied by the 1RF waves is Vs/f, the potential applied from the dc power supply is Vdc, the number of ions irradiated from the plasma to the target is Iion, and the ion energy per ion irradiated is Eion, the following relationship holds:

$$A = Iion \times Eion$$
$$Eion = |Vp| + |Vs/f| \quad (|Vs/fp| > |Vdc|)$$
$$= |Vp| + |Vdc| \quad (|Vs/fp| < |Vdc|)$$

Then, in the case of using an Si target, Eion is usually less than $-120$ V. In view of the above relationship, the load potential applied during the sputtering step was set to $-100$ V.

Figure 4:
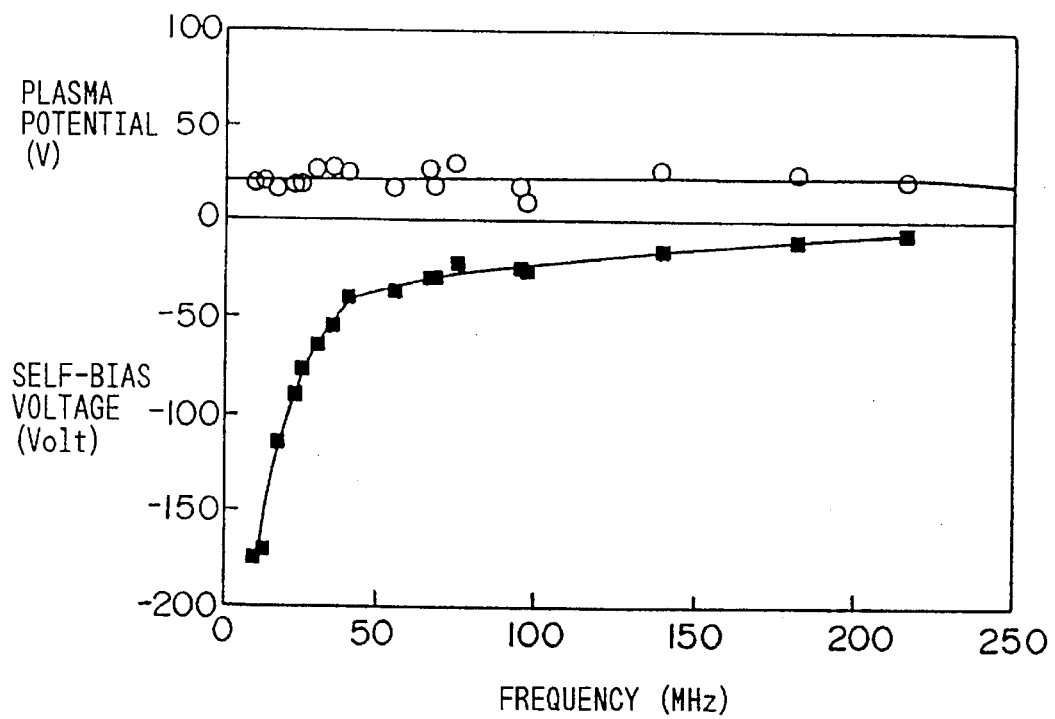
FIG. 4 is a graph showing the relationship of frequency of an RF power versus a self-bias voltage and a plasma potential.
Figure 5:
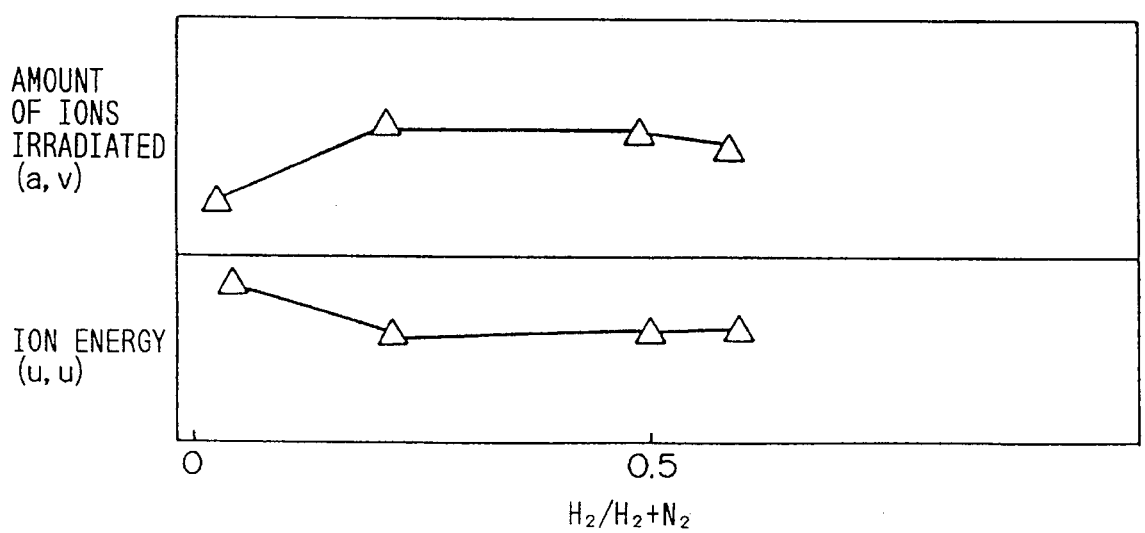
FIG. 5 is a graph showing the relationship of the type of rare gas versus ion energy and an amount of ions irradiated.
Figure 6:
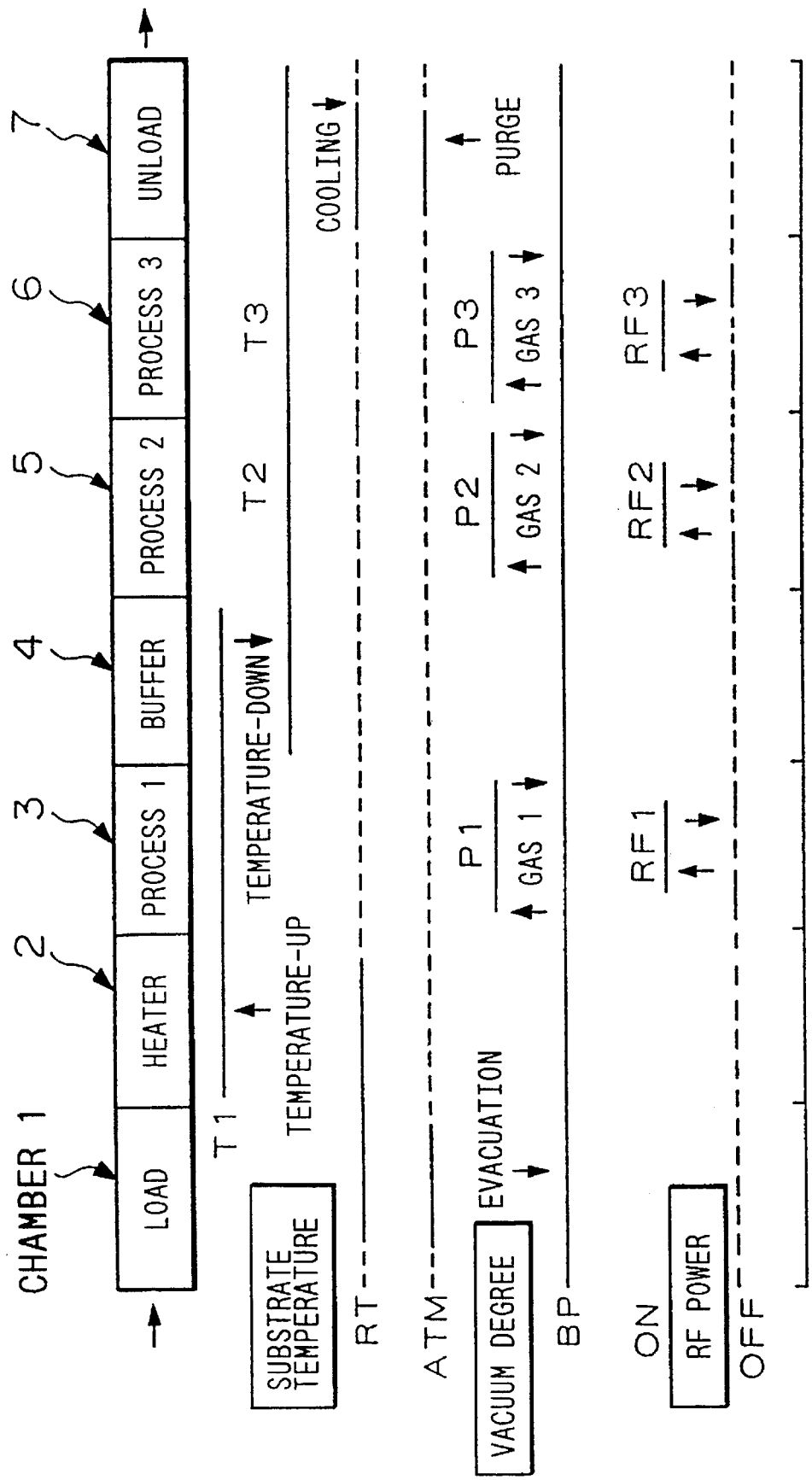
FIG. 6 is a diagram showing part of one example of a conventional TFT manufacturing process.
Figure 7:
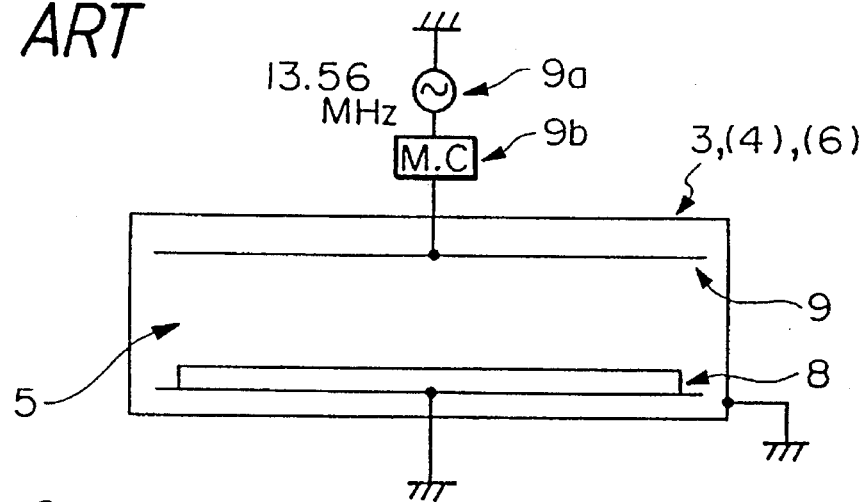
FIG. 7 is a view showing a structure of one example of a deposition chamber in a conventional film manufacturing apparatus.
Figure 8:
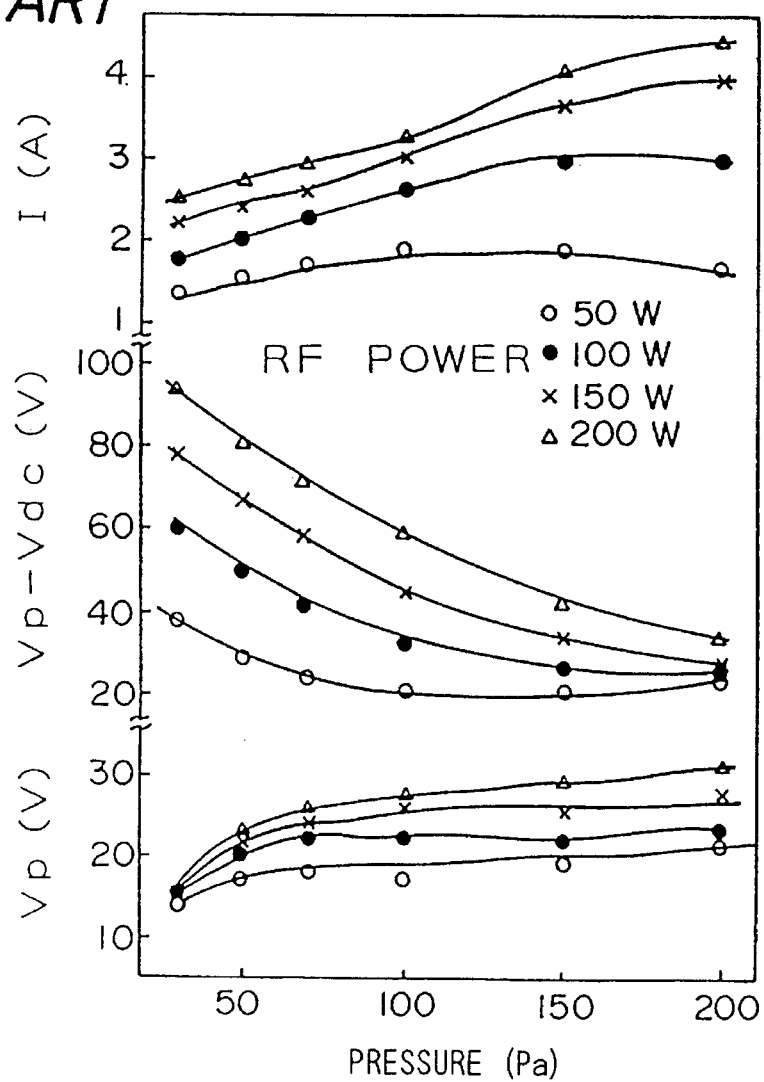
FIG. 8 is a graph showing the relationship of a pressure versus an amount of ions irradiated to a substrate and ion energy irradiated to an opposite electrode in the conventional apparatus.
Figure 9:
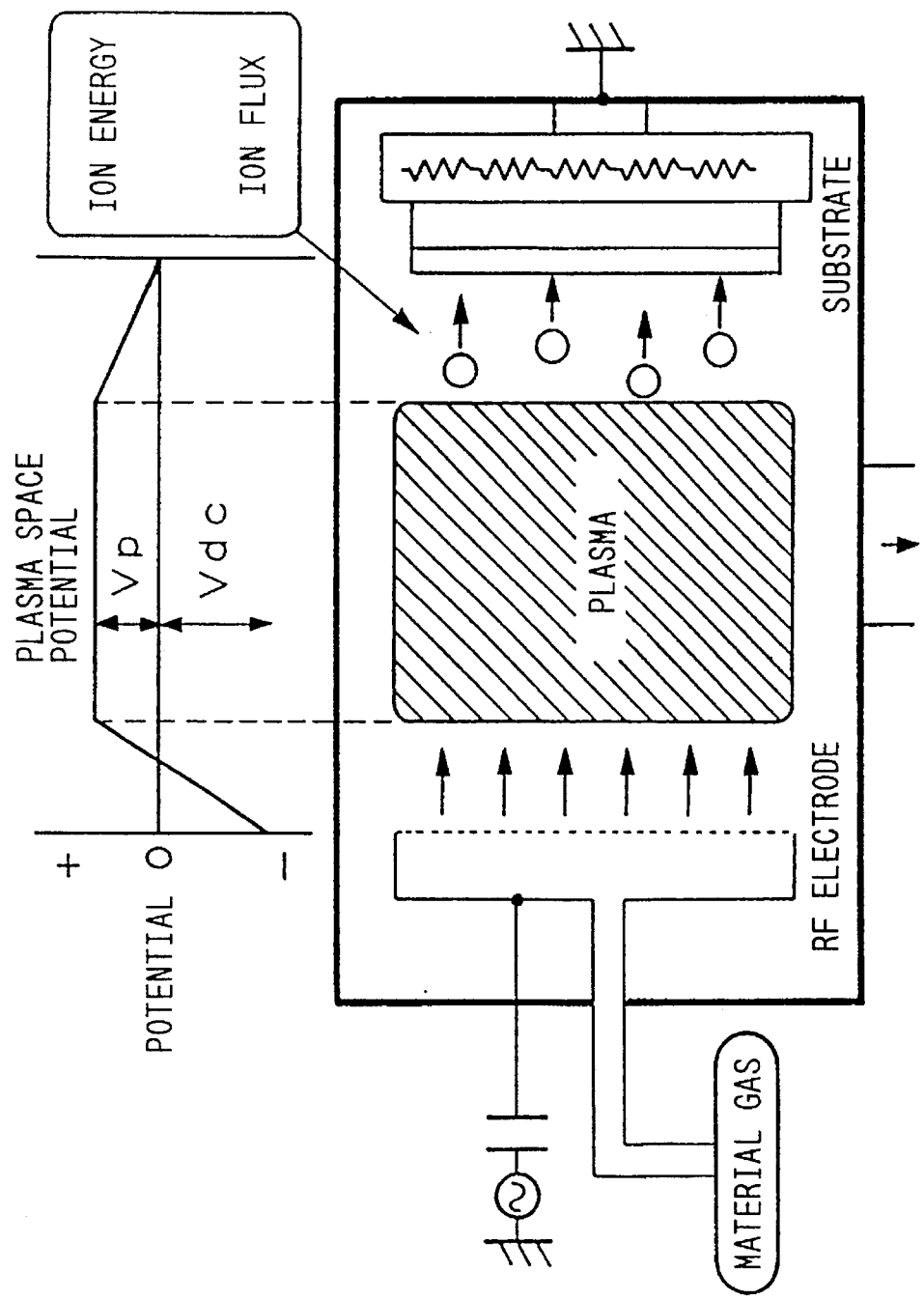
FIG. 9 is a graph showing the relationship between an amount of ions irradiated to a substrate and ion energy irradiated to an opposite electrode in the conventional apparatus.

FIG. 4 shows the manner in which the self-bias of the electrode is varied when RF waves of an RF power for plasma excitation are changed from 10 MHz to 210 MHz on condition that the Ar gas pressure in the deposition chamber 10 is $7 \times 10^{-3}$ Torr, the RF power is 100 W, the electrode spacing is 3 cm, and the electrode diameter is 10 cm. It is apparent from FIG. 4 that the negative self-bias is abruptly reduced as the frequency increases.

Further, because there exists the relationship of ion energy=|plasma potential|+|self-bias voltage|, the higher the frequency, the smaller is the ion energy. If the power is increased at the same frequency, the self-bias is increased to provide a higher plasma density.

From the above relationship, it is preferable to set the frequency to 200 MHz and increase the power for achieving the higher plasma density and the smaller ion energy. As a result, the conditions were set as per described above.

In the film manufacturing apparatus of this embodiment, since the RF power can be supplied to both the first electrode 20 and the second electrode 22 separately, the ion energy and the amount of ions irradiated can be controlled independently of each other. More specifically, in the prior art, since the RF waves are applied from only one electrode, the ion energy and the amount of ions irradiated are varied simultaneously upon changes in the RF power and the pressure in the deposition chamber, making it impossible to deposit films by CVD and sputtering in a single deposition chamber. In contrast, the apparatus of this embodiment is arranged to control the amount of ions irradiated with the RF power applied to one electrode, and the ion energy with the RF power applied to the other electrode. Therefore, films can be deposited by CVD and sputtering in the same deposition chamber 10 as described above.

Moreover, with the ohmic contact layer formed by the sputtering, toxic special material gases, e.g., phosphine $PH_3$ or diborane $B_2H_6$, are no longer required to deposit the ohmic contact layer by properly selecting a composition of the sputtering target. It is thus possible to prevent contamination of the wall surface of the deposition chamber and danger caused by those material gases. Additionally, the plasma parameters can be controlled independently of each other and, therefore, the types of gases used can be reduced.

As described hereinabove, according to the present invention, since films are deposited by CVD and sputtering successively without exposing the substrate to an oxidative atmosphere, the film formed in the previous step is not detrimentally oxidized when laminating the films. The next film can be deposited on the film which is not detrimentally oxidized, and hence the films having a desired composition can be laminated.

Since the first and second electrodes are provided in the deposition chamber and are supplied with the RF power separately, the ion bombardment energy and the ion flux can be controlled independently of each other. Accordingly, it is possible to produce plasma with a high plasma density in spite of small ion energy, and to surely perform the plasma cleaning of the deposition chamber.

By attaching the sputtering larger to the second electrode and supplying the RF power to both the electrodes separately, a film can be formed on the substrate while controlling the plasma density by one electrode and controlling the ion energy of plasma by the other electrode. Thus, the film deposition by sputtering can be performed under optimum conditions.

Further, with the apparatus including the deposition chamber, the transfer mechanism, the first electrode, the second electrode, the first RF power supply, and the second RF power supply, the CVD process and the sputtering process can be effected in one deposition chamber. As a result, the number of deposition chambers can be reduced as compared with the prior art, making it possible to achieve a reduction in size and weight of the apparatus and to reduce the area necessary for installing it.

Also, by applying the bias potential of −100 V or below during the sputtering while the RF power is being supplied, the sputtering efficiency can be increased.

Thus, according to the present invention, contamination in the deposition chamber can be surely removed by carrying out the plasma cleaning after the CVD step, and another film can be deposited by the sputtering subsequently. Therefore, the film deposition by CVD and sputtering can be effected in the same deposition chamber just by changing conditions of the power supplies without causing any contamination of film elements.

Practically, non-single crystal silicon films and nitride films of non-single crystal silicon can be formed by the CVD process, and non-single crystal silicon films containing phosphor or boron can be formed by the sputtering process.

As a result, the present invention can be effectively applied to, in particular, the case of manufacturing devices such as TFT's in which various films are laminated.

What is claimed is:

1. A method for forming thin films in a single pressure-reducible deposition chamber having spaced-apart first and second electrodes, the method comprising the steps of:

forming a first film by chemical vapor deposition (CVD) by:
attaching a dummy target to the first electrode, the dummy target being formed from a material which resists reaction during CVD, thereby preventing contamination of the first film,
attaching a substrate to said second electrode,
supplying reactive gas into said deposition chamber,
supplying high frequency electrical power to said first electrode and to said second electrode, thereby depositing the first film on said substrate by CVD,
removing remaining reactive gases and the dummy target from the deposition chamber, and forming a second film on the substrate by a sputtering process by:
attaching a sputtering target to said first electrode,
supplying reactive gas into said deposition chamber,
simultaneously supplying high frequency electrical power to said first electrode and to said second electrode, thereby depositing the second film on said substrate by sputtering,
wherein the steps of forming the first film and forming the second film are carried out successively without exposing said substrate to an oxidative atmosphere.

2. The method of claim 1,
wherein the step of attaching the dummy target to the first electrode comprises removing the dummy target from a storage chamber disposed adjacent the deposition chamber by an automated transfer mechanism,
wherein the step of removing the dummy target from the first electrode comprises replacing the dummy target in the deposition chamber using the automated transfer mechanism, and
wherein the step of attaching the sputtering target to the first electrode comprises removing the sputtering target from the storage chamber using the automated transfer mechanism.

3. A method for forming thin films in a single pressure-reducible deposition chamber having spaced-apart first and second electrodes, the method comprising the steps of:

forming a first film by a sputtering process by:
attaching a sputtering target to the first electrode,
attaching a substrate to the second electrode,
supplying reactive gas into the deposition chamber,
simultaneously supplying high frequency electrical power to the first electrode and to the second electrode, thereby depositing the first film on the substrate by sputtering, and
removing remaining sputtering gases and the sputtering target from the deposition chamber; and forming a second film on the substrate by chemical vapor deposition (CVD) by:
attaching a dummy target to the first electrode, the dummy target being formed from a material which resists reaction during CVD, thereby preventing contamination of the second film,
supplying reactive gas into the deposition chamber,
supplying high frequency electrical power to the first electrode and to the second electrode, thereby depositing the second film on the substrate by CVD,
wherein the steps of forming the first film and forming the second film are carried out successively without exposing the substrate to an oxidative atmosphere.

4. The method of claim 3,
wherein the step of attaching the sputtering target to the first electrode comprises removing the sputtering target from a storage chamber disposed adjacent the deposition chamber by an automated transfer mechanism, wherein the step of removing the sputtering target from the first electrode comprises replacing the sputtering target in the deposition chamber using the automated transfer mechanism, and wherein the step of attaching the dummy target to the first electrode comprises removing the dummy target from the storage chamber using the automated transfer mechanism.

* * * * *